(12) United States Patent
Kim

(10) Patent No.: US 8,994,629 B2
(45) Date of Patent: Mar. 31, 2015

(54) GATE SHIFT REGISTER AND DISPLAY DEVICE COMPRISING THE SAME

(71) Applicant: LG Display Co., Ltd., Seoul (KR)

(72) Inventor: Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 177 days.

(21) Appl. No.: 13/710,043

(22) Filed: Dec. 10, 2012

(65) Prior Publication Data

US 2014/0085285 A1    Mar. 27, 2014

(30) Foreign Application Priority Data

Sep. 27, 2012 (KR) .................. 10-2012-0107924

(51) Int. Cl.
*G09G 3/22* (2006.01)
*G09G 5/00* (2006.01)
*G11C 19/28* (2006.01)
*G09G 3/32* (2006.01)
*G09G 3/36* (2006.01)

(52) U.S. Cl.
CPC ............... *G09G 5/003* (2013.01); *G11C 19/28* (2013.01); *G09G 3/22* (2013.01); *G09G 3/3266* (2013.01); *G09G 3/3677* (2013.01); *G09G 2330/02* (2013.01); *G09G 2310/0289* (2013.01); *G09G 2370/08* (2013.01)
USPC .......................................... 345/87; 345/211

(58) Field of Classification Search
CPC ..................... G09G 3/22; G09G 2310/0289
USPC ................................................. 345/87, 211
See application file for complete search history.

(56) References Cited

U.S. PATENT DOCUMENTS

| 2006/0007085 A1* | 1/2006 | Kim et al. ................. 345/87 |
| 2009/0051576 A1* | 2/2009 | Dedic et al. ............. 341/136 |
| 2010/0188385 A1* | 7/2010 | Boiko ....................... 345/211 |
| 2014/0085285 A1* | 3/2014 | Kim ........................... 345/211 |

* cited by examiner

*Primary Examiner* — Amare Mengistu
*Assistant Examiner* — Joseph G Rodriguez
(74) *Attorney, Agent, or Firm* — Birch, Stewart, Kolasch & Birch, LLP

(57) ABSTRACT

According to an embodiment, a gate shift register includes a plurality of stages cascade-connected to each other. An nth one of the stages includes: a pull-up transistor that outputs any one of gate shift clocks as an nth scan pulse of a gate high voltage in accordance with the potential of a Q node; a pull-down transistor that is connected to the pull-up transistor through an output node, and outputs a low-potential voltage as an nth scan pulse of a gate low voltage in accordance with the potential of a QB node; and a switching circuit that charges and discharges the Q node and the QB node, respectively, or vice versa in response to a set signal and a reset signal, wherein an adaptively adjusted variable high-potential voltage is applied to the QB node to correspond to a shift in the threshold voltage of the pull-down transistor.

7 Claims, 13 Drawing Sheets

GATE SHIFT REGISTER AND DISPLAY DEVICE COMPRISING THE SAME

This application claims the benefit of Korean Patent Application No. 10-2012-0107924 filed on Sep. 27, 2012, which is incorporated herein by reference for all purposes as if fully set forth herein.

BACKGROUND

1. Field

This document relates to a gate shift register and a display device comprising the same.

2. Related Art

Various flat panel displays capable of reducing the weight and the size of a cathode ray tube have been developed and have been put on the market. In general, a scan driving circuit of the flat panel display sequentially supplies a scan pulse to scan lines using a gate shift register.

The gate shift register of the scan driving circuit comprises a plurality of stages each including a plurality of thin film transistors (TFTs). The stages are cascade-connected to one another and sequentially generate scan pulses. FIG. 1 shows an example of an nth stage for generating an nth scan pulse Vg(n). FIG. 2 is a waveform diagram for explaining the operation of FIG. 1. Transistors to be described hereinafter may be implemented as TFTs.

Referring to FIGS. 1 and 2, the nth stage comprises a Q node for controlling a switching operation of a pull-up transistor Tpu and a QB node for controlling a switching operation of a pull-down transistor Tpd. The pull-up transistor Tpu is turned on in a first output period X1 in which the potential VQ of the Q node is maintained at a bootstrapping level BH to output a shift clock signal CLKn as an nth scan pulse Vg(n) of a gate high voltage VGH. The pull-up transistor Tpu is turned off during a second output period X2 in which the potential V1 of the Q node is maintained at a discharge level L. The potential VQB of the QB node is maintained at the discharge level L during the first output period X1 and at a charge level H during the second output period X2. Due to the potential VQB of the QB node, the pull-down transistor Tpd is turned on during the second output period X2 to output a low-potential voltage VSS as an nth scan pulse Vg(n) of a gate low voltage VGL. In a third output period X3 prior to the first output period X1, the potential VQ of the Q node is maintained at the charge level H, and the potential VQB of the QB node is maintained at the discharge level L.

First, fifth, and sixth transistors T1, T5, and T6 connected to the Q node control the potential VQ of the Q node by a switching operation. The first transistor T1 charges the Q node in response to a set signal SET during a third output period X3. The set signal SET may be selected as an (n−1)th scan pulse Vg(n−1). The fifth transistor T5 discharges the Q node in response to a reset signal RESET during the second output period X2. The reset signal RESET may be selected as an (n+1)th scan pulse Vg(n+1). The sixth transistor T6 maintains the Q node at the discharge level L when the QB node is maintained at the charge level H during the second output period X2.

Second to fourth transistors T2, T3, and T4 connected to the QB node control the potential VQB of the QB node by a switching operation. The second transistor T2 discharges the QB node in response to a reset signal RESET during the third output period X3. The third transistor T3 discharges the QB node in accordance with the potential VQ of the Q node in the third output period X3 and the first output period X1. The fourth transistor T4 supplies a high-potential voltage VDD to the QB node. The high-potential voltage VDD is charged in the QB node in the second output period X2 in which the second and third transistors T2 and T3 are turned off.

In this manner, the Q node and QB node in each stage are charged and discharged, respectively, or vice versa. That is, when the Q node is charged (including bootstrapping), the QB node is discharged; or conversely, when the Q node is discharged, the QB node is charged. A scan pulse has to be generated at the gate high voltage VGH only for a short period of time X1 to charge a data voltage in 1 horizontal pixel line and at the gate low voltage VGL for the remaining period. Accordingly, a period (i.e., second output period X2) of one frame, in which the potential VQB of the QB node is maintained at the charge level H, is much longer than a period (i.e., first and third output periods X1 and X3) in which the potential VQB of the QB node is maintained at the discharge level L.

In general, when a gate voltage of the same polarity is applied to gate electrodes of the TFTs for a long time, gate-bias stress is increased so that the threshold voltage of the TFTs is increased. A drain-source current Ids of the TFTs is determined by the gate-source voltage Vgs of the TFTs and the threshold voltage of the TFTs. As shown in FIG. 4, if the threshold voltage of the TFTs increases with the passage of driving time, the drain-source current Ids of the TFTs is reduced.

In FIGS. 1 to 3, a gate electrode of the pull-down transistor Tpd and a gate electrode of the sixth transistor T6 are connected to the QB node which is maintained at the charge level H for most of the time X2 of one frame. Accordingly, the pull-down transistor Tpd and the sixth transistor T6 may be degraded due to a threshold voltage shift with the passage of driving time. Particularly, if the high-potential voltage VDD is applied to the QB node at a constant charge level H from an initial period of driving, such degradation is accelerated. If the pull-down transistor Tpd is degraded, a scan pulse is not maintained at the gate low voltage VGL but may gradually rise or be generated in undesired multiple waveforms.

SUMMARY

Accordingly, the present invention has been made in an effort to provide a gate shift register which stabilizes the output of scan pulses by minimizing device degradation resulting from the passage of driving time and a display device comprising the same.

An exemplary embodiment of the present invention provides a gate shift register comprising a plurality of stages cascade-connected to each other, an nth one of the stages comprising: a pull-up transistor that outputs any one of gate shift clocks as an nth scan pulse of a gate high voltage in accordance with the potential of a Q node; a pull-down transistor that is connected to the pull-up transistor through an output node, and outputs a low-potential voltage as an nth scan pulse of a gate low voltage in accordance with the potential of a QB node; and a switching circuit that charges and discharges the Q node and the QB node, respectively, or vice versa in response to a set signal and a reset signal, wherein an adaptively adjusted variable high-potential voltage is applied to the QB node to correspond to a shift in the threshold voltage of the pull-down transistor.

An exemplary embodiment of the present invention provides a display device comprising a gate shift register, the display device comprising: a display panel; a gate shift register comprising a plurality of stages cascade-connected to each other and sequentially supplying scan pulses to scan lines of the display panel; a threshold voltage sensing circuit comprising a monitoring TFT and a detection TFT and outing a sensed voltage; and a VDD regulator circuit that calculates the threshold voltage of a pull-down transistor included in each of the stages, adaptively adjusts a variable high-potential voltage based on the calculated threshold voltage, and gives feedback to the threshold voltage sensing circuit, an nth one of the stages comprising: a pull-up transistor that outputs any one of gate shift clocks as an nth scan pulse of a gate high voltage in accordance with the potential of a Q node; a pull-down transistor that is connected to the pull-up transistor through an output node, and outputs a low-potential voltage as an nth scan pulse of a gate low voltage in accordance with the potential of a QB node; and a switching circuit that charges and discharges the Q node and the QB node, respectively, or vice versa in response to a set signal and a reset signal, wherein an adaptively adjusted variable high-potential voltage is applied to the QB node to correspond to a shift in the threshold voltage of the pull-down transistor.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Hereinafter, an exemplary embodiment of the present invention will be described with reference to FIGS. 5 to 17.

Figure 1:
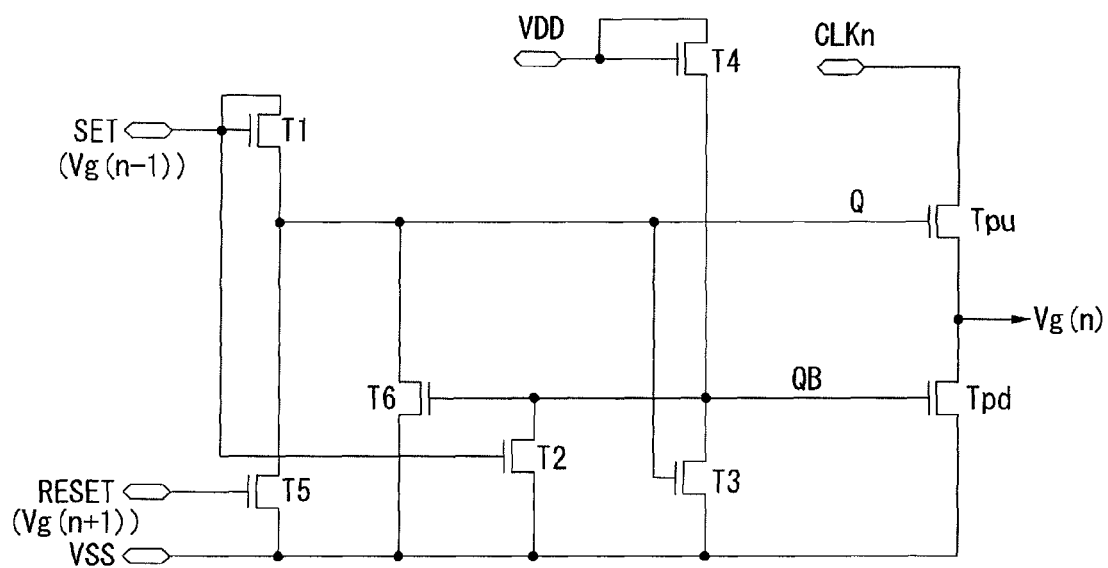
FIG. 1 is a view showing the configuration of an nth stage of a conventional gate shift register.
Figure 2:
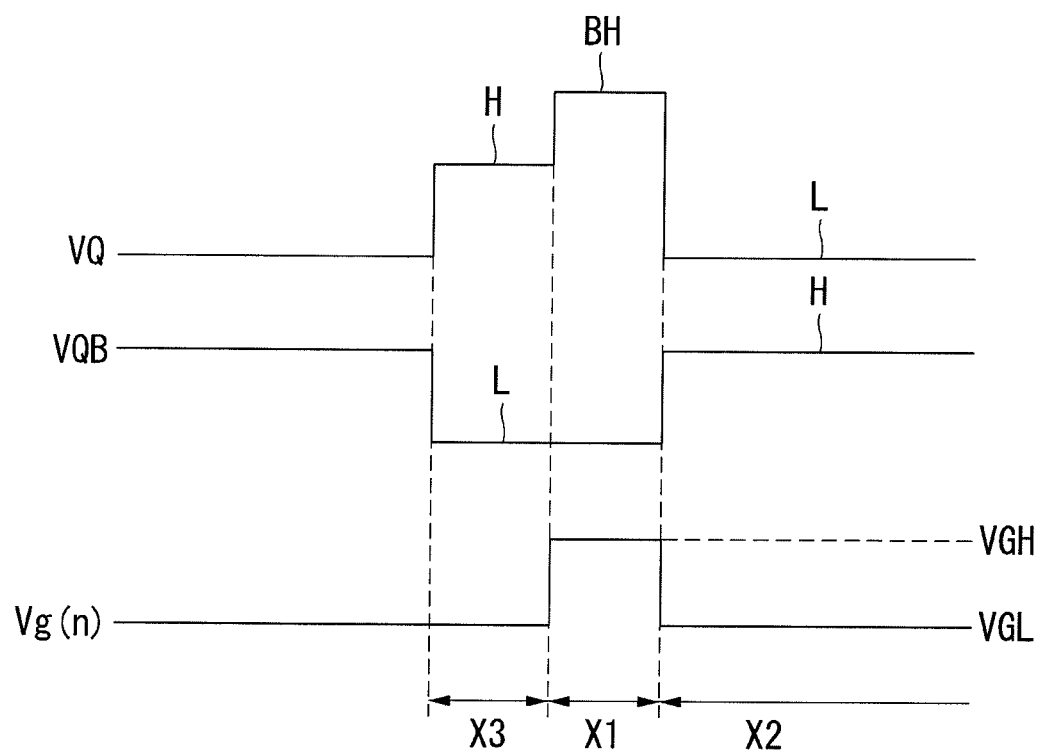
FIG. 2 is a waveform diagram for explaining the operation of FIG. 1.
Figure 3:
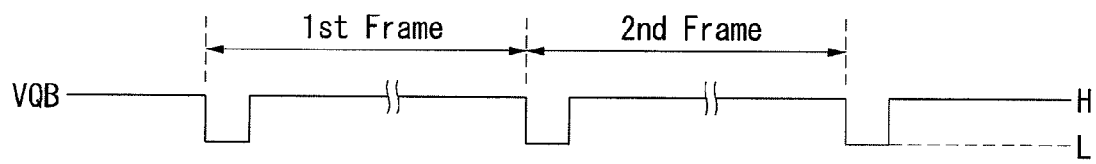
FIG. 3 is a waveform diagram showing the potential of a QB node for a plurality of frames.
Figure 4:
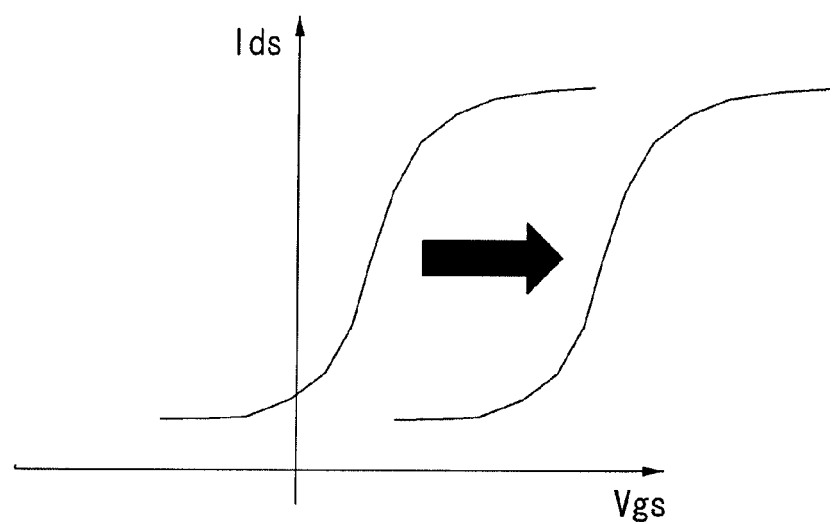
FIG. 4 is a view showing a shift in the threshold voltage of a TFT with the passage of driving time.
Figure 5:
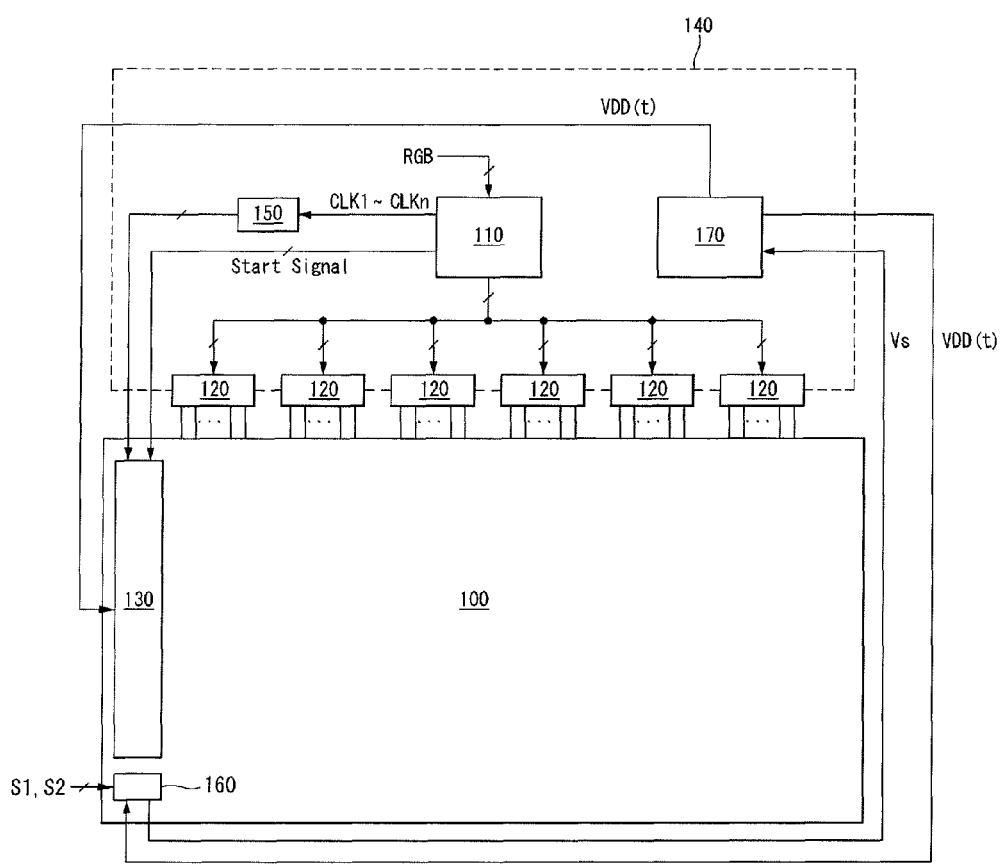
FIG. 5 is a view schematically showing a display device according to an exemplary embodiment of the present invention.

FIG. 5 is a view schematically showing a display device according to an exemplary embodiment of the present invention.

Referring to FIG. 5, the display device of the present invention comprises a display panel 100, a data driving circuit, a scan driving circuit, a timing controller 110, a threshold voltage sensing circuit 160, and a VDD regulator circuit 170.

The display panel 100 comprises data lines and scan lines crossing each other and pixels arranged in a matrix form. The display panel 100 may be implemented as a display panel for a variety of well-known flat panel displays. For example, the display panel 100 may be implemented as a display panel for a liquid crystal display (LCD), an organic light emitting diode (OLED) display, and an electrophoresis display (EPD).

The data driving circuit comprises a plurality of source drive ICs 120. Each of the source drive ICs 120 receives digital video data RGB from the timing controller 110. Each of the source drive ICs 120 converts the digital video data RGB into a gamma compensation voltage in response to a source timing control signal received from the timing controller 110 and generates a data voltage. Each of the source drive ICs 120 then supplies the data voltage to the data lines of the display panel 100, so that the data voltage is synchronized with a scan pulse. Each of the source drive ICs may be connected to the data lines of the display panel 100 through a chip-on-glass (COG) process or a tape automated bonding (TAB) process.

The scan driving circuit comprises a level shifter 150 connected between the timing controller 110 and the scan lines of the display panel 100 and a gate shift register 130.

The level shifter 150 level-shifts a transistor-transistor logic (TTL) level voltage of n-phase gate shift clocks CLK1 to CLKn (n is a positive integer equal to 2 or greater) received from the timing controller 110 to a gate high voltage VGH and a gate low voltage VGL.

The gate shift register 130 shifts a gate start pulse in response to the gate shift clocks CLK1 to CLKn to sequentially output scan pulses. The gate shift register 130 comprises a plurality of stages cascade-connected to each other. Each of the stages may be implemented as an SR latch circuit shown in FIG. 6 or an SR latch circuit shown in FIG. 9. In the SR latch circuit of FIG. 6, a variable high-potential voltage VDD(t), which is adaptively adjusted to correspond to a shift in the threshold voltage of the pull-down transistor Tpd, is applied to a QB node connected to a gate electrode of a pull-down transistor Tpd. The variable high-potential voltage VDD(t) is applied to the QB node after it is adjusted to gradually increase in proportion to degradation of the pull-down transistor Tpd. Moreover, the SR latch circuit shown in FIG. 9 comprises first and second pull-down transistors Tpdo and Tpde which are alternately driven every predetermined period. In the SR latch circuit of FIG. 9, a first variable high-potential VDDo(t), which is adaptively adjusted to correspond to a shift in the threshold voltage of the first pull-down transistor Tpdo, is applied to a QBo node connected to a gate electrode of the first pull-down transistor Tpdo, and a second variable high-potential voltage VDDe(t), which is adaptively adjusted to correspond to a shift in the threshold voltage of the second pull-down transistor Tpde, is applied to a QBe node connected to a gate electrode of the second pull-down transistor Tpde. The first and second variable high-potential voltages VDDo(t) and VDDe(t) are selectively applied to the QBo node and the QBe node after they are adjusted to gradually increase in proportion to degradation of the first and second pull-down transistors Tpdo and Tpde. In the present invention, a high-potential voltage is adjusted to become relatively low in the initial period of driving, and the high-potential voltage is gradually increased to the charge level H as degradation develops with the passage of driving time, rather than applying a constant high-potential voltage having a charge level H to the QB nodes QBo and QBe from an initial period of driving according to the conventional art. By doing so, the present invention can reduce degradation of the pull-down transistors.

The gate shift register 130 may be directly formed on a lower substrate of the display panel 100 through a gate-driver in panel process. In the GIP process, the level shifter 150 may be mounted on a PCB 140.

The timing controller 110 receives digital video data RGB from an external host computer through an interface, such as a low voltage differential signaling (LVDS) interface and a transition minimized differential signaling (TMDS) interface. The timing controller 110 transmits the digital video data RGB received from the external host computer to the source drive ICs 120.

The timing controller 110 receives a timing signal, such as a vertical sync signal Vsync, a horizontal sync signal Hsync, a data enable DE, and a main clock MCLK, from the host computer through a LVDS or TMDS interface receiving circuit. The timing controller 110 generate timing control signals for controlling operation timings of the data driving circuit and the scan driving circuit based on the timing signal received from the host computer. The timing control signals comprise a scan timing control signal for controlling the operation timing of the scan driving circuit and a data timing control signal for controlling the operation timing of the source drive ICs 120 and a polarity of the data voltage.

The scan timing control signal comprises a gate start pulse (not shown), gate shift clocks CLK1 to CLKn, a gate output enable GOE (not shown), and the like. The gate start pulse is input into the gate shift register 130 to control shift start timing. The gate shift clocks CLK1 to CLKn are level-shifted through the level shifter 150 and then are input into the gate shift register 130. The gate shift clocks CLK1 to CLKn are used as a clock signal for shifting the gate start pulse. The gate output enable controls the output timing of the gate shift register 130.

The data timing control signal comprises a source start pulse, a source sampling clock SSC, a polarity control signal POL, a source output enable SOE, and the like. The source start pulse SSP controls the shift start timing of the source drive ICs 120. The source sampling clock SSC is a clock signal for controlling the sampling timing of data inside the source drive ICs 120 based on a rising or falling edge. The polarity control signal POL controls a polarity of the data voltage output from the source drive ICs 120. If a data transfer interface between the timing controller 110 and the source drive ICs 120 is a mini LVDS interface, the source start pulse SSP and the source sampling clock SSC may be omitted.

The threshold voltage sensing circuit 160 comprises a monitoring TFT having similar degradation conditions to those of the pull-down transistors of the stages. The threshold voltage sensing circuit 160 senses a specific node voltage Vs of the monitoring TFT with the passage of driving time every predetermined period by using a variable high-potential voltage VDD(t) and a monitoring pulse S, and then outputs the sensed voltage Vs through a detection TFT to be switched on in response to a detection pulse S2. Like the gate shift register 130, the threshold voltage sensing circuit 160 may be directly formed on the lower substrate of the display panel 100.

The VDD regulator circuit 170 calculates the threshold voltage of the pull-down transistor included in each of the stages, based on the sensed voltage Vs of the monitoring TFT input from the threshold voltage sensing circuit 160, and adaptively adjusts the variable high-potential voltage VDD(t) by using the calculated threshold voltage. The VDD regulator circuit 170 applies the adaptively adjusted, variable high-potential voltage VDD(t) to the QB node of FIG. 6, the QBo node or QBe node of FIG. 9, and a gate electrode of the monitoring TFT. The VDD regulator circuit 170 may be mounted on the PCB 140.

Figure 6:
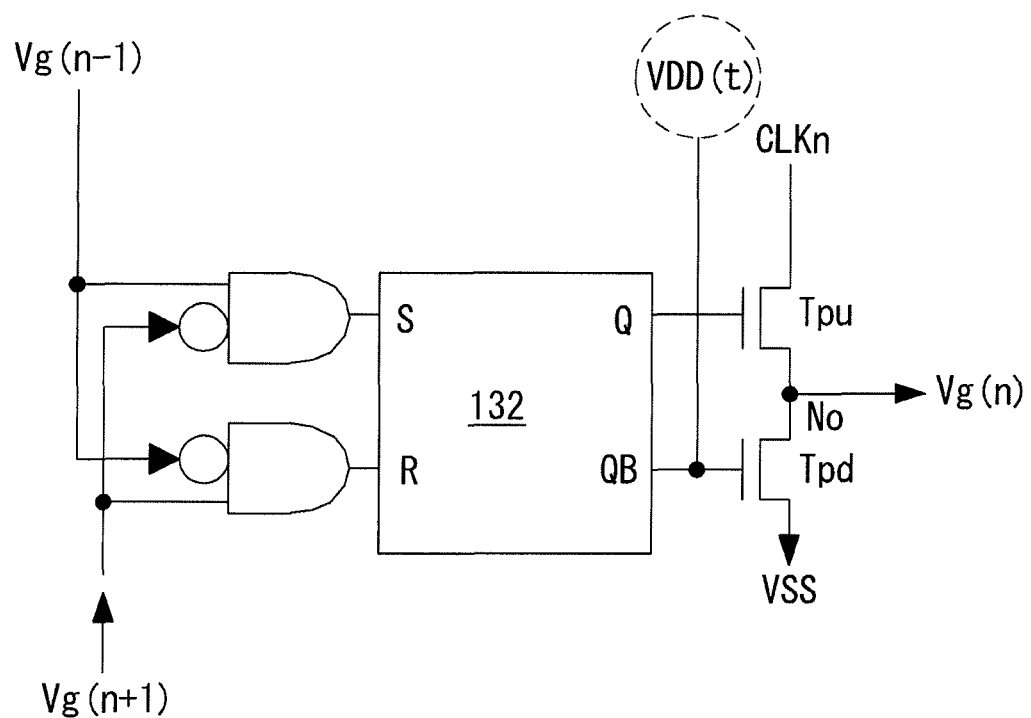
FIGS. 6 and 7 show an example of the configuration of a stage to which a variable high-potential voltage is applied.
Figure 7:
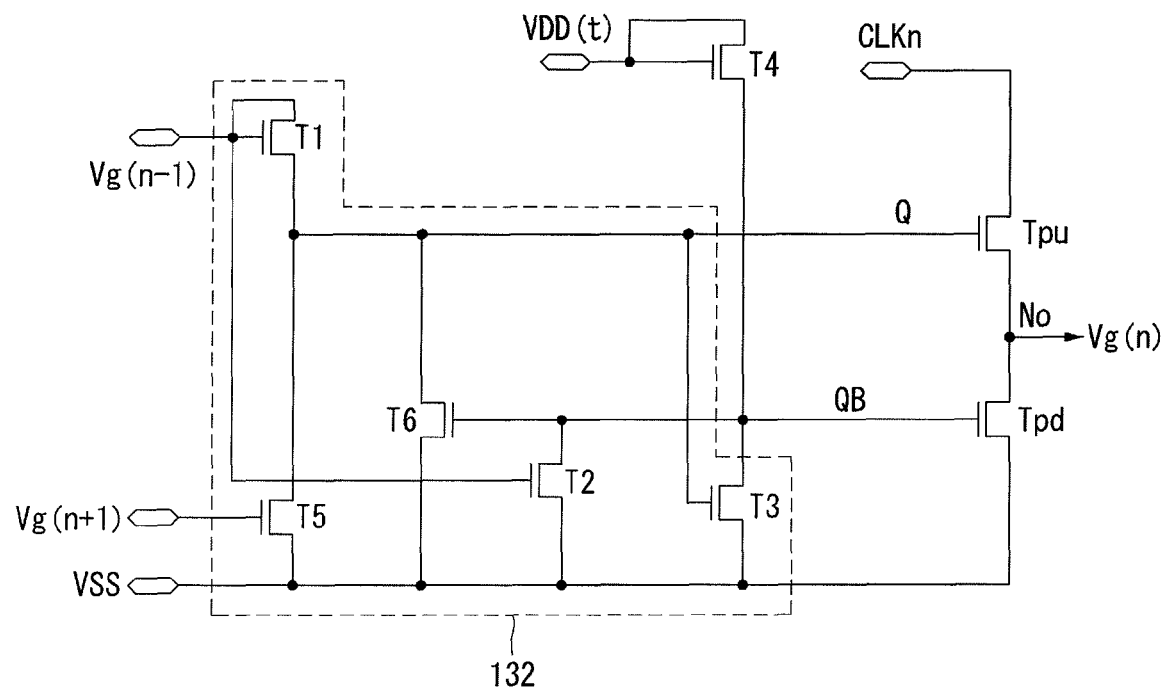
Figure 8:
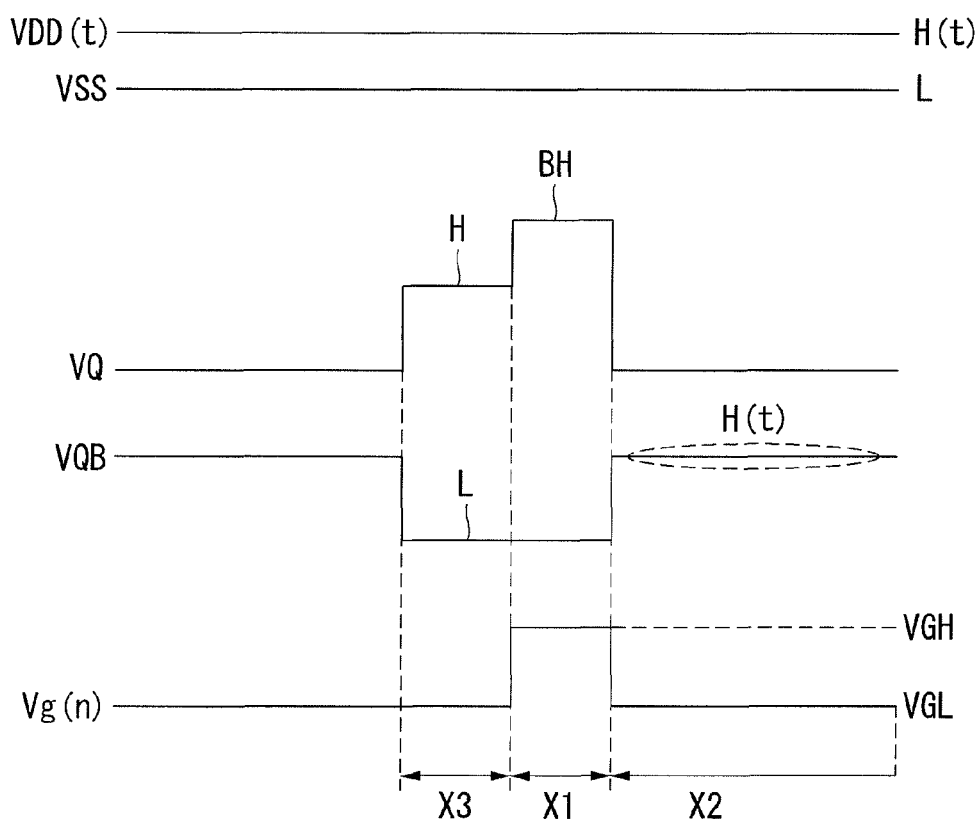
FIG. 8 is a waveform diagram for explaining the operation of FIG. 7.

FIGS. 6 and 7 show an example of the configuration of a stage to which a variable high-potential voltage VDD(t) is applied. FIG. 8 is a waveform diagram for explaining the operation of FIG. 7.

FIGS. 6 and 7 show an nth stage for generating an nth scan pulse Vg(n). The nth stage comprises a pull-up transistor Tpu having a gate electrode connected to a Q node, a pull-down transistor Tpd having a gate electrode connected to a QB node, and a switching circuit 132 for charging and discharging the Q node and the QB node, respectively, and vice versa in response to a set signal and a reset signal. The pull-up transistor Tpu and the pull-down transistor Tpd are connected in series to each other through an output node No from which the nth scan pulse Vg(n) is output. The set signal may be any one of scan pulses generated earlier than the nth scan pulse Vg(n) within the same frame, for example, an (n−1)th scan pulse Vg(n−1). The reset signal may be any one of scan pulses generated later than the nth scan pulse Vg(n) within the same frame, for example, an (n+1)th scan pulse Vg(n+1).

The variable high-potential voltage VDD(t) is applied to the QB node through a fourth transistor T4. The switching circuit 132 comprises first, second, third, and fifth transistors T1, T2, T3, and T5, and controls the potential of the Q node and the QB node to be inverse to each other. The first, fifth, and sixth transistors T1, T5, and T6 connected to the Q node control the potential VQ of the Q node by a switching operation. The first transistor T1 charges the Q node in response to an (n−1)th scan pulse Vg(n−1) of a gate high voltage VGH during a third output period X3. The fifth transistor T5 charges the Q node in response to an (n+1)th scan pulse Vg(n+1) of the gate high voltage VGH during a second output period X2. The sixth transistor T6 maintains the Q node at a discharge level L when the QB node is maintained at a regulated level H(t) during the second output period X2. The second and third transistors T2 and T3 connected to the QB node control the potential VQB of the QB node by a switching operation. The second transistor T2 discharges the QB node in response to the (n−1)th scan pulse Vg(n−1) of the gate high voltage VGH during the third output period X3. The third transistor T3 discharges the QB node in accordance with the potential V1 of the Q node in the third output period X3 and a first output period X1.

The operation of the nth stage will be described below with reference to FIG. 8.

The pull-up transistor Tpu is turned on in a first output period X1 in which the potential VQ of the Q node is maintained at a bootstrapping level BH to output a shift clock signal CLKn as an nth scan pulse Vg(n) of a gate high voltage VGH. The pull-up transistor Tpu is turned off during a second output period X2 in which the potential V1 of the Q node is maintained at a discharge level L. The potential VQB of the QB node is maintained at the discharge level L during the first output period X1 and at a regulated level H(t) during the second output period X2. The regulated level H(t) is determined by a variable high-potential voltage VDD(t), and serves to turn on the pull-down transistor Tpd and minimize a shift in the threshold voltage of the pull-down transistor Tpd. The regulated level H(t) is set between the discharge level L and a charge level H, and periodically adjusted every given period to correspond to a shift in the threshold voltage of the pull-down transistor Tpd. By the potential VQB of the QB node maintained at the regulated level H(t), the pull-down transistor Tpd is turned on during the second output period X2 to output a low-potential voltage VSS as an nth scan pulse Vg(n) of a gate low voltage VGL. In the first output period X1 and a third output period X3 prior to the first output period X1, the potential VQB of the QB node is maintained at the discharge level L, and the pull-down transistor Tpd is turned off.

Figure 9:
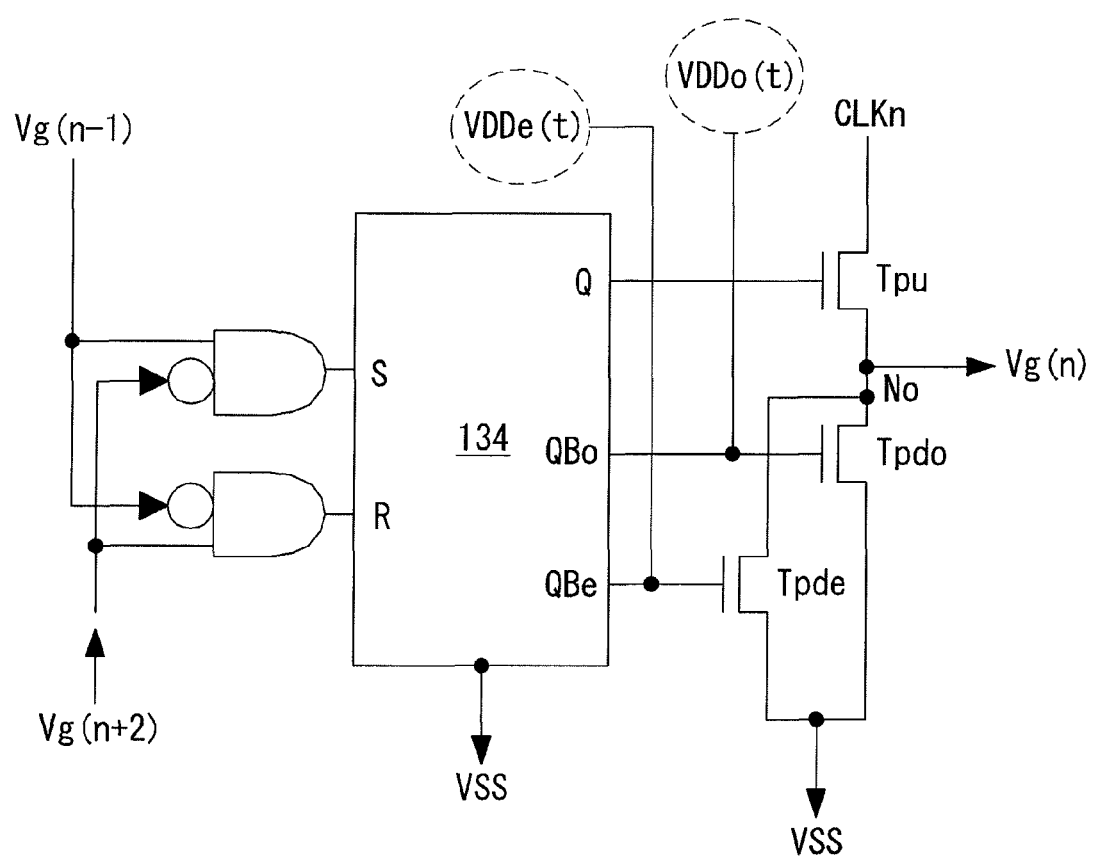
FIGS. 9 and 10 show another example of the configuration of a stage to which a variable high-potential voltage is applied.
Figure 10:
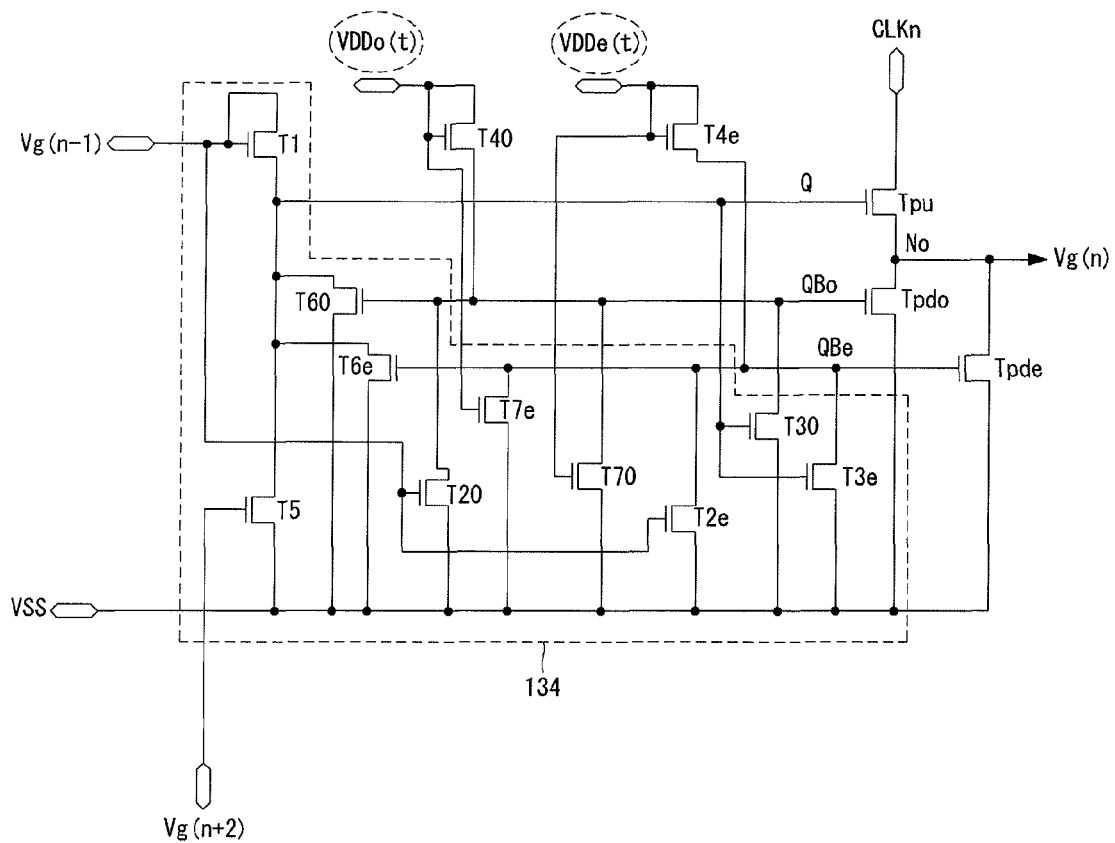
Figure 11:
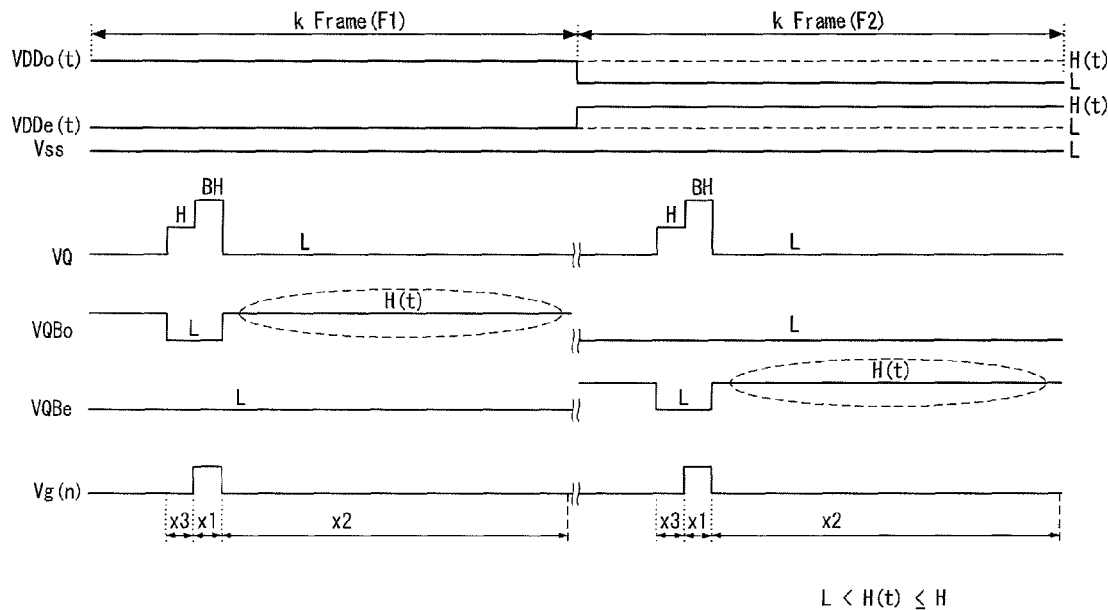
FIG. 11 is a waveform diagram for explaining the operation of FIG. 10.

FIGS. 9 and 10 show another example of the configuration of a stage to which a variable high-potential voltage VDD(t) is applied. FIG. 11 is a waveform diagram for explaining the operation of FIG. 10.

FIGS. 9 and 10 show an nth stage for generating an nth scan pulse Vg(n). The nth stage comprises a pull-up transistor Tpu having a gate electrode connected to a Q node, a first pull-down transistor Tpdo having a gate electrode connected to a QBo node, a second pull-down transistor Tpde having a gate electrode connected to a QBe node, and a switching circuit 134 for charging and discharging the Q node and the QBo node (or QBe node), respectively, and vice versa in response to a set signal and a reset signal. The first pull-down transistor Tpdo and the second pull-down transistor Tpde are connected in parallel between the output node No and an input terminal of a low-potential voltage VSS, and alternately driven every given period. The pull-up transistor Tpu is connected in series to the first pull-down transistor Tpdo and the second pull-down transistor Tpde through the output node No from which the nth scan pulse Vg(n) is output. The reset signal may be any one of scan pulses generated later than the nth scan pulse Vg(n), for example, an (n+2)th scan pulse Vg(n+2).

The variable high-potential voltage VDD(t) comprises a first variable high-potential voltage VDDo(t) and a second variable high-potential voltage VDDe(t). The first variable high-potential voltage VDDo(t) and the second variable high-potential voltage VDDe(t) have the discharge level L and the regulated level H(t), respectively, and vice versa, and repeatedly switch between these levels every given period. As shown in FIG. 11, it is assumed that, during k frame F1 (k is a positive integer equal to 1 or greater), the first variable high-potential voltage VDDo(t) is supplied at the regulated level H(t) and the second variable high-potential voltage VDDe(t) is supplied at the discharge level L, during k frames (k is a positive integer equal to 1 or greater). Conversely, in the next k frames F2, the first variable high-potential voltage VDDo(t) is supplied at the discharge level L, and the second variable high-potential voltage VDDe(t) is supplied at the regulated level H(t). The first variable high-potential voltage VDDo(t) is applied to the QBo node through a fourth odd transistor T4o, and the second variable high-potential voltage VDDe(t) is applied to the QBe node through a fourth even transistor T4e.

The switching circuit 134 comprises first, second odd, second even, third odd, third even, fifth, sixth odd, sixth even, seventh odd, and seventh even transistors T1, T2o, T2e, T3o, T3e, T5, T6o, T6e, T7o, and T7e, and control the potential of the Q node and the potential of the QBo node to be inverse to each other or control the potential of the Q node and the potential of the QBe node to be inverse to each other. The first, fifth, sixth odd, and sixth even transistors T1, T5, T6o, and T6e connected to the Q node control the potential VQ of the Q node by a switching operation. The first transistor T1 charges the Q node in response to an (n−1)th scan pulse Vg(n−1) of a gate high voltage VGH during a third output period X3. The fifth transistor T5 discharges the Q node I response to an (n+2)th scan pulse Vg(n+2) of the gate high voltage VGH during a second output period X2. The sixth odd transistor T6o maintains the Q node at the discharge level L when the QBe node is maintained at the regulated level H(t).

During F1, the second odd, third odd, and seventh odd transistors T2o, T3o, and T7o connected to the QB node control the potential VQBo of the QBo node by a switching operation. The second odd transistor T2o discharges the QBo node in response to an (n−1)th scan pulse Vg(n−1) of a gate high voltage VGH during a third output period X3 of F1. The third odd transistor T3o discharges the QBo node in accordance with the potential VQ of the Q node in the third output period X3 and first output period X1 of F1. The seventh odd transistor T7o discharges the QBo node in a second output period X2 of F2. The first variable high-potential voltage VDDo(t) is applied to the QBo node at the regulated level H(t) in a second output period X2 of F1 in which the second and third odd transistors T2o and T3o are turned off.

During F1, the second even, third even, and seventh even transistors T2e, T3e, and T7e connected to the QBe node control the potential VQBe of the QBe node by a switching operation. The second even transistor T2e discharges the QBe node in response to the (n−1)th scan pulse Vg(n−1) of the gate high voltage VGH during a third output period X3 of F2. The third even transistor T3e discharges the QBe node in accordance with the potential VQ of the Q node in the third output period X3 and first output period X1 of F2. The seventh even transistor T7e discharges the QBe node in the second output period X2 of F2. The second variable high-potential voltage VDDe(t) is applied to the QBe node at the regulated level H(t) in the second output period X2 of F1 in which the second and third odd transistors T2o and T3o are turned off.

The operation of the nth stage will be described with reference to FIG. 11. The operation of FIG. 11 is almost identical to the operation of FIG. 8, except that the first and second pull-down transistors Tpdo and Tpde are alternately driven every k frames to prevent degradation.

The pull-up transistor Tpu is turned on in a first output period X1 in which the potential VQ of the Q node is maintained at a bootstrapping level BH to output a shift clock signal CLKn as an nth scan pulse Vg(n) of a gate high voltage VGH. The pull-up transistor Tpu is turned off during a second output period X2 in which the potential V1 of the Q node is maintained at a discharge level L. During F1 in which the first pull-down transistor Tpdo is driven, the potential VQBo of the QBo node is maintained at the discharge level L during the first output period X and at the regulated level H(t) during the second output period X2. During F2 in which the second pull-down transistor Tpde is driven, the potential VQBe of the QBe node is maintained at the discharge level L during the first output period X1 and at the regulated level H(t) during the second output period X2. The regulated level H(t) is determined by a variable high-potential voltage VDD(t), and serves to turn on the pull-down transistors Tpdo and Tpde and minimize a shift in the threshold voltage of the pull-down transistors Tpdo and Tpde. The regulated level H(t) is set between the discharge level L and a charge level H, and periodically adjusted every given period to correspond to a shift in the threshold voltage of the pull-down transistors Tpdo and Tpde. By the potential VQBo of the QBo node maintained at the regulated level H(t), the first pull-down transistor Tpdo is turned on during the second output period X2 of F1 to output a low-potential voltage VSS as an nth scan pulse Vg(n) of a gate low voltage VGL. Also, by the potential VQBe of the QBe node maintained at the regulated level H(t), the second pull-down transistor Tpde is turned on during the second output period X2 of F2 to output the low-potential voltage VSS as the nth scan pulse Vg(n) of the gate low voltage VGL. In the first output period X1 of F1 and a third output period X3 prior to the first output period X1, the potential VQBo of the QBo node is maintained at the discharge level L, and the first pull-down transistor Tpdo is turned off. Also, in the first output period X1 of F2 and a third output period X3 prior to the first output period X1, the potential VQBe of the QBe node is maintained at the discharge level L, and the second pull-down transistor Tpde is turned off.

Figure 12:
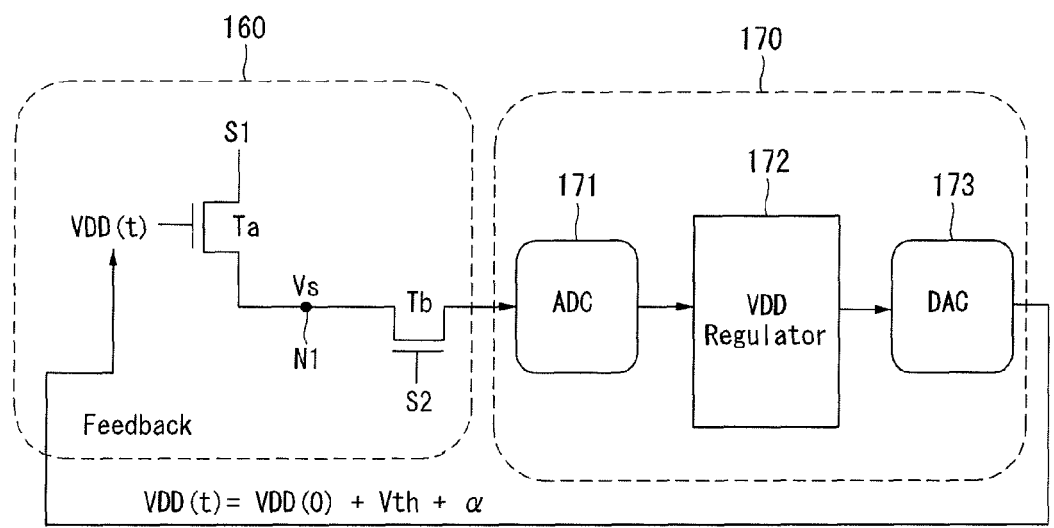
FIG. 12 shows detailed configurations of a threshold voltage sensing circuit and a VDD regulator circuit which are used to determine the variable high-potential voltage applied to the stage of FIG. 6.
Figure 13:
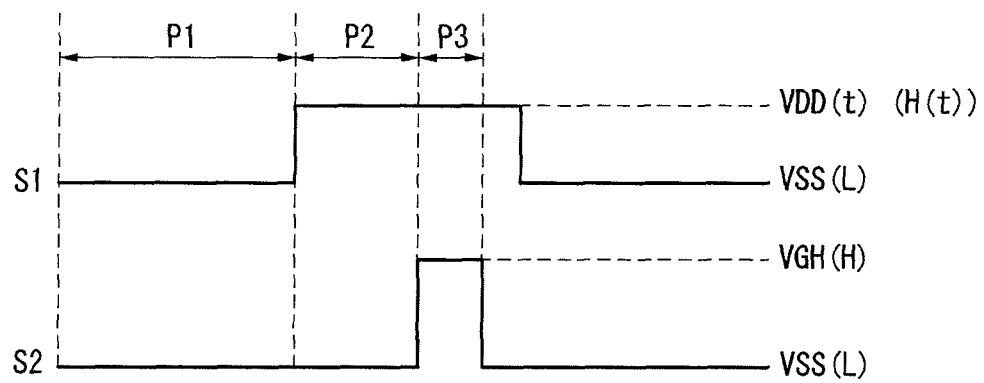
FIG. 13 is a view showing driving pulses required for the operation of the threshold voltage sensing circuit of FIG. 12.

FIG. 12 shows detailed configurations of the threshold voltage sensing circuit 160 and the VDD regulator circuit 170 which are used to determine the variable high-potential voltage VDD(t) applied to the stage of FIG. 6. FIG. 13 is a view showing driving pulses required for the operation of the threshold voltage sensing circuit 160 of FIG. 12.

Referring to FIG. 12, the threshold voltage sensing circuit 160 comprises a monitoring TFT Ta and a detection TFT Tb connected together through a first node N1.

The monitoring TFT Ta is designed to have similar degradation conditions to those of the pull-down transistors of the stages. A control electrode (gate electrode) of the monitoring TFT Ta is connected to an input terminal of a variable high-potential voltage VDD(t), a first electrode (drain electrode) of the monitoring TFT Ta is connected to an input terminal of a monitoring pulse S1, and a second electrode (source electrode) of the monitoring TFT Ta is connected to the first node N1. The monitoring pulse S1 swings between the variable high-potential voltage VDD(t) having a regulated level H(t) and the low-potential voltage VSS having a discharge level L every given period. The high level of the monitoring pulse S1 may increase every given period by the variable high-potential voltage VDD(t) having the regulated level H(t). The monitoring TFT Ta charges a sensed voltage Vs, which is obtained by subtracting a threshold voltage Vth from the variable high-potential voltage VDD(t), in the first node N1 in response to the variable high-potential voltage VDD(T) applied to the gate electrode and the monitoring pulse S1 applied to the drain electrode. The monitoring pulse S1 may be generated from a driving pulse generator (not shown). The driving pulse generator receives the variable high-potential voltage VDD(t) from the VDD regulator circuit 170 every given period, and generates the monitoring pulse S1 based on the variable high-potential voltage VDD(t) and outputs it to the threshold voltage sensing circuit 160.

The detection TFT Tb outputs the sensed voltage Vs charged in the first node N1 to the VDD regulator circuit 170 in response to the detection pulse S2. A control (gate electrode) of the detection TFT Tb is connected to an input terminal of the detection pulse S2, a first electrode (drain electrode) of the detection TFT Tb is connected to the first node N1, and a second electrode (source electrode) of the detection TFT Tb is connected to an input terminal of the VDD regulator circuit 170. The detection pulse S2 swings between the gate high voltage having a charge level H and the low-potential voltage VSS having the discharge level L with the same period as the monitoring pulse S1. The detection pulse S2 having the charge level H overlaps with the monitoring pulse S1 having the regulated level H(t). The width of the charge level H of the detection pulse S2 is narrower than the width of the regulated level H(t) of the monitoring pulse S1. The detection pulse S2 may be generated from a driving pulse generator (not shown).

As shown in FIG. 13, the threshold voltage sensing circuit 160 outputs a sensed voltage Vs required to calculate the threshold voltage of the monitoring TFT Ta in a bias stress application period P1, a sensed voltage charging period P2, and a sensed voltage detection period P3.

The bias stress application period P1 indicates a period in which both the monitoring pulse S1 and the detection pulse S2 are maintained at the discharge level L. In the bias stress application period P1, a given voltage (i.e., variable high-potential voltage applied to the QB node of the stages) is applied to the gate electrode of the monitoring TFT Ta. As a result, the monitoring TFT Ta is degraded in substantially the same condition as the pull-down transistors of the stages.

The sensed voltage charging period P2 indicates a period in which the monitoring pulse S1 is maintained at the charge level H and the detection pulse S2 is maintained at the discharge level L. In the sensed voltage charging period P2, the monitoring pulse S1 having the charge level H is applied to the drain electrode of the monitoring TFT Ta. Accordingly, the drain potential of the monitoring TFT Ta rises to a reference high-potential voltage VDD while the gate potential of the monitoring TFT Ta is maintained at the above given voltage. In this way, the sensed voltage Vs charged in the first node N1 gradually rises to a value VDD−Vth obtained by subtracting the threshold voltage Vth of the monitoring TFT Ta from the reference high-potential voltage VDD. When the sensed voltage Vs reaches "VDD−Vth", the monitoring TFT Ta is turned off.

The sensed voltage detection period P3 indicates a period in which both the monitoring pulse S1 and the detection pulse S2 are maintained at the charge level H. In the sensed voltage detection period P3, the detection TFT Tb is turned on to output the sensed voltage Vs charged in the first node N1 to the VDD regulator circuit 170.

The VDD regulator circuit 170 comprises an analog-to-digital converter (hereinafter, ADC) 171, a VDD regulator 172, and a digital-to-analog converter (hereinafter, DAC) 173.

The ADC 171 analog-to-digital converts the sensed voltage Vs input from the threshold voltage sensing circuit 160 and supplies it to the VDD regulator 172.

The VDD regulator 172 calculates the threshold voltage Vth of the pull-down transistors based on the digitally converted sensed voltage Vs, and applies the calculated threshold voltage Vth to the following Equation 1 to adaptively adjust the variable high-potential voltage VDD(t):

$$VDD(t)=VDD(0)+Vth+\alpha \qquad \text{[Equation 1]}$$

where VDD( )) denotes the initial set value of the high-potential voltage, Vth denotes the threshold voltage of the pull-down transistors, and α denotes a proportional constant for adaptive adjustment.

The DAC 173 digital-to-analog converts the adaptively adjusted variable high-potential voltage VDD(t) and then gives feedback to the gate electrode of the monitoring TFT Ta. Also, the DAC 173 applies the adjusted variable high-potential voltage VDD(t) to the QB nodes of the stages.

Figure 14:
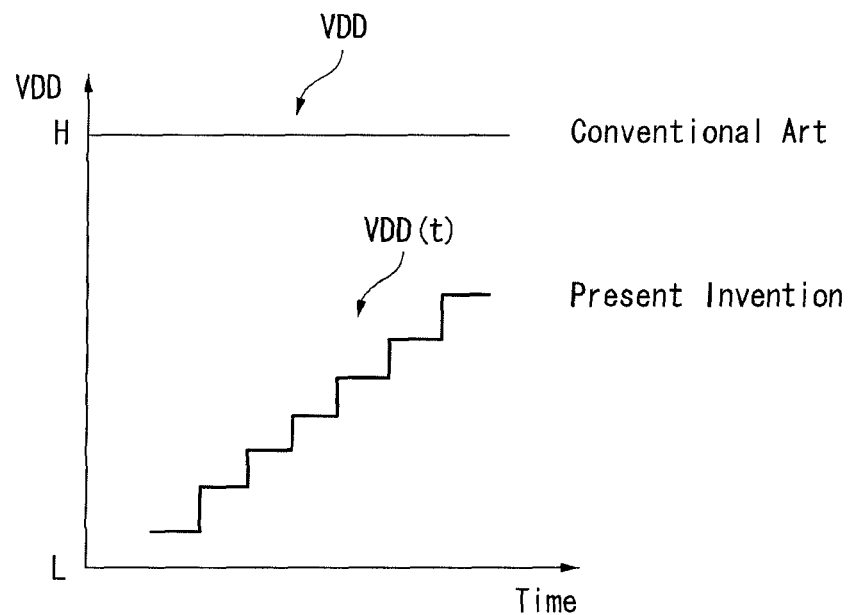
FIG. 14 shows that the variable high-potential voltage is adjusted in a stepwise manner to correspond to a threshold voltage shift.

FIG. 14 shows that the variable high-potential voltage VDD(t) is adjusted in a stepwise manner to correspond to a threshold voltage shift.

The sensing of the threshold voltage and the adjustment of the variable high-potential voltage VDD(t) described with reference to FIGS. 12 and 13 are repeated every given period (e.g., k frames). Since the threshold voltage of the pull-down transistors gradually increase with the passage of driving time, the variable high-potential voltage VDD(t) is adjusted to gradually increase every given period as shown in FIG. 14.

Conventionally, the high-potential voltage VDD is applied to the QB node at a constant charge level H from the initial period of driving, thus accelerating degradation of the pull-down transistors. In the present invention, the variable high-potential voltage VDD(t) is maintained to be lower than the reference high-potential voltage VDD having the charge level H in the initial period of driving, during which the threshold voltage of the pull-down transistors is less degraded, within a range in which no malfunction occurs, and then the variable high-potential VDD(t) is increased in a stepwise manner by taking into account that the threshold voltage of the pull-down transistors increases with the passage of driving time. As such, degradation of the threshold voltage of the pull-down transistors can be suppressed as much as possible.

Figure 15:
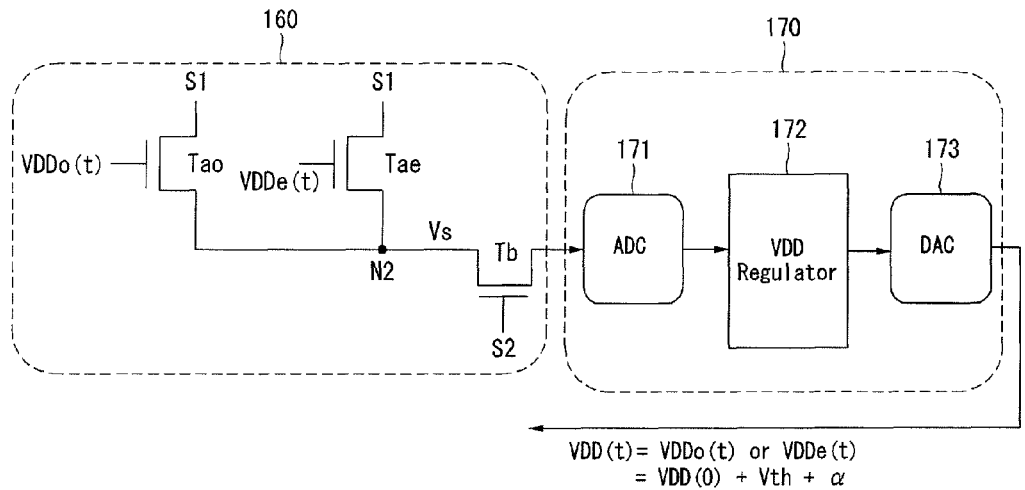
FIG. 15 shows detailed configurations of a threshold voltage sensing circuit and a VDD regulator circuit which are used to determine the variable high-potential voltage applied to the stage of FIG. 9.
Figure 16:
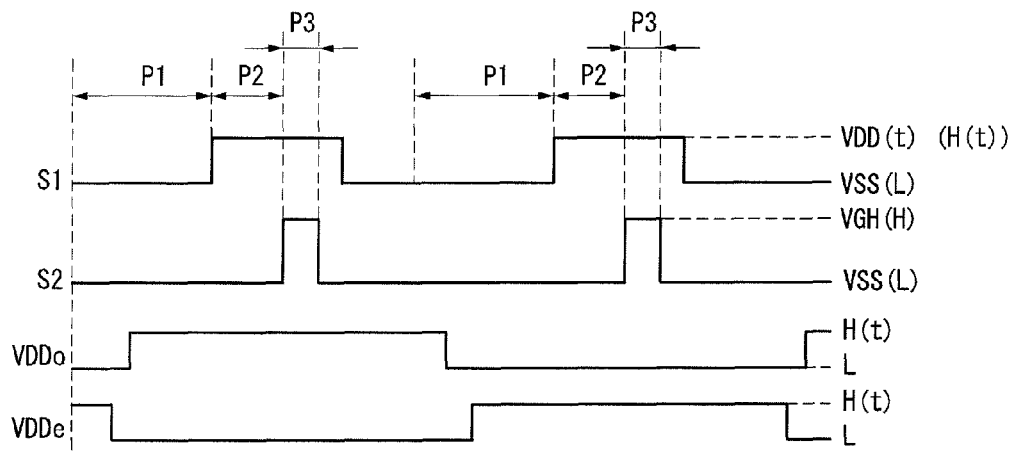
FIG. 16 is a view showing driving pulses required for the operation of the threshold voltage sensing circuit of FIG. 15.

FIG. 15 shows detailed configurations of a threshold voltage sensing circuit and a VDD regulator circuit which are used to determine the variable high-potential voltage VDD(t) applied to the stage of FIG. 9. FIG. 16 is a view showing driving pulses required for the operation of the threshold voltage sensing circuit 160.

Referring to FIG. 15, the threshold voltage sensing circuit 160 comprises a first monitoring TFT Tao and a second monitoring TFT Tae connected in parallel to a second node N1 and a detection TFT Tb connected to the first and second monitoring TFTs Tao and Tao through the second node N1.

The first monitoring TFT Tao is designed to have similar degradation conditions to those of the first pull-down transistors of the stages, and the second monitoring TFT Tae is designed to have similar degradation conditions to those of the second pull-down transistors of the stages. The first monitoring TFT Tao and the second monitoring TFT Tae alternately perform a sensing operation every given period, and charge the sensed voltage Vs, obtained by subtracting the threshold voltage Vth from the variable high-potential voltage VDD9t) having the regulated level H(t), in the second node N2. In the sensed voltage charging period P2 of FIG. 16, if the first variable high-potential VDDo(t) has the regulated level H(t), the sensing operation is performed by the first monitoring TFT Tao; and conversely, if the second variable high-potential voltage VDDe(t) has the regulated level H(t), the sensing operation is performed by the second monitoring TFT Tae.

Regarding the threshold voltage sensing circuit 160, the sensing operation of any one of the first and second monitoring TFTs Tao and Tae and a detection operation of the detection TFT Tb are substantially identical to those explained in FIGS. 12 and 13, so detailed descriptions thereof will be omitted. Regarding the VDD regulator circuit 170, an operation of alternately adjusting the first variable high-potential voltage VDDo(t) and the second variable high-potential voltage VDDe(t) in a stepwise manner every given period based on input information from the threshold voltage sensing circuit 160 is substantially identical to that explained in FIGS. 12 and 13, so a detailed description thereof will be omitted.

Figure 17:
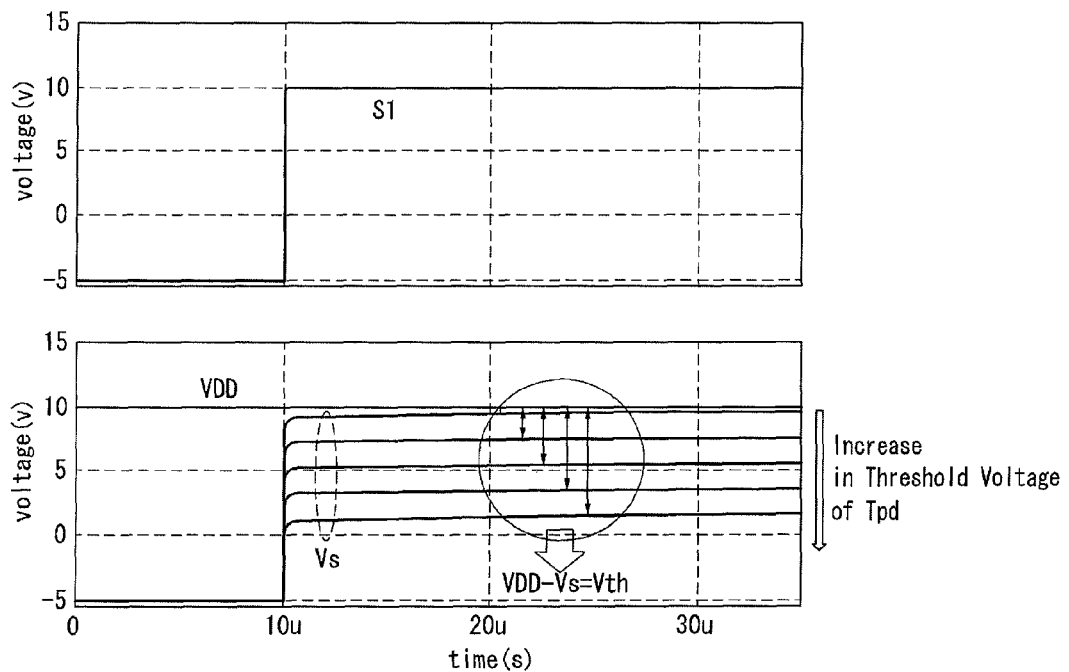
FIG. 17 shows simulation results of the detection of the threshold voltage of a pull-down transistor.

FIG. 17 shows simulation results of the detection of the threshold voltage of a pull-down transistor.

Referring to FIG. 17, these simulation results show that the threshold voltage Vth of the pull-down transistor Tpd increases with the passage of driving time and the level of a detected sensed voltage Vs decreases with the increase in threshold voltage Vth. The reference high-potential voltage VDD is a preset value (e.g., 10 V), and the sensed voltage Vs is a voltage that can be found by detection. Accordingly, the threshold voltage Vth of the pull-down transistor Tpd becomes "VDD–Vs". In the present invention, the threshold voltage Vth of the pull-down transistor Tpd is calculated based on the sensed voltage Vs, and the variable high-potential voltage is adaptively adjusted in response to the threshold voltage Vth, thereby minimizing degradation of the pull-down transistor Tpd.

As discussed above, in the present invention, a threshold voltage sensing circuit, which is operable in similar degradation conditions to those of the pull-down transistors that are most degraded in the gate shift register, is used such that the variable high-potential voltage VDD(t) is maintained to be lower than the reference high-potential voltage VDD having the charge level H in the initial period of driving, during which the threshold voltage of the pull-down transistors is less degraded, within a range in which no malfunction occurs, and then the variable high-potential VDD(t) is increased in a stepwise manner by taking into account that the threshold voltage of the pull-down transistors increases with the passage of driving time. As such, the output of scan pulses can be stabilized by suppressing degradation of the threshold voltage of the pull-down transistors as much as possible, thereby extending the life span of the gate shift register.

Throughout the description, it should be understood for those skilled in the art that various changes and modifications are possible without departing from the technical principles of the present invention. Therefore, the technical scope of the present invention is not limited to those detailed descriptions in this document but should be defined by the scope of the appended claims.

What is claimed is:

1. A display device comprising a gate shift register, the display device comprising:
   a display panel;
   a gate shift register comprising a plurality of stages cascade-connected to each other and sequentially supplying scan pulses to scan lines of the display panel;
   a threshold voltage sensing circuit comprising a monitoring TFT and a detection TFT and outing a sensed voltage; and
   a VDD regulator circuit that calculates a threshold voltage of a pull-down transistor included in each of the plurality of stages, adaptively adjusts a variable high-potential voltage based on the calculated threshold voltage, and gives feedback to the threshold voltage sensing circuit,
   wherein an nth one of the plurality of stages comprising:
   a pull-up transistor that outputs any one of gate shift clocks as an nth scan pulse of a gate high voltage in accordance with a potential of a Q node for controlling a switching operation of the pull-up transistor;
   a pull-down transistor that is connected to the pull-up transistor through an output node, and outputs a low-potential voltage as an nth scan pulse of a gate low voltage in accordance with a potential of a QB node for controlling a switching operation of the pull-down transistor; and
   a switching circuit that charges and discharges the Q node and the QB node, respectively, or vice versa in response to a set signal and a reset signal,
   wherein an adaptively adjusted variable high-potential voltage is applied to the QB node to correspond to a shift in the threshold voltage of the pull-down transistor, and
   wherein the monitoring TFT charges the sensed voltage, which is obtained by subtracting the threshold voltage from the variable high-potential voltage, in a first node in response to the variable high-potential voltage and a monitoring pulse applied to a first electrode: and the detection TFT outputs the sensed voltage charged in the first node to the VDD regulator circuit in response to a detection pulse applied to a control electrode.

2. The display device of claim 1, wherein the variable high-potential voltage is adjusted to gradually increase in proportion to a shift in the threshold voltage of the pull-down transistor.

3. The display device of claim 2, wherein the variable high potential voltage is adjusted to increase in a stepwise manner every predetermined period.

4. The display device of claim 1, wherein the set signal is any one of scan pulses generated earlier than the nth scan pulse within the same frame, and the reset signal is any one of scan pulses generated later than the nth scan pulse within the same frame.

5. A display device comprising a gate shift register, the display device comprising:
a display panel;
a gate shift register comprising a plurality of stages cascade-connected to each other and sequentially supplying scan pulses to scan lines of the display panel;
a threshold voltage sensing circuit comprising a monitoring TFT and a detection TFT and outputting a sensed voltage; and
a VDD regulator circuit that calculates a threshold voltage of a pull-down transistor included in each of the plurality of stages, adaptively adjusts a variable high-potential voltage based on the calculated threshold voltage, and gives feedback to the threshold voltage sensing circuit,
wherein an nth one of the plurality of stages comprising:
a pull-up transistor that outputs any one of gate shift clocks as an nth scan pulse of a gate high voltage in accordance with a potential of a Q node for controlling a switching operation of the pull-up transistor;
a first pull-down transistor and a second pull-down transistor which are connected in parallel between the output node No and an input terminal of a low-potential voltage and alternately output a low-potential voltage as an nth scan pulse of a gate low voltage in accordance with a potential of a QBo node and a potential of a QBe, respectively, the QBo node being for controlling a switching operation of the first pull-down transistor, the QBe node being for controlling a switching operation of the second pull-down transistor, the QBo node and the QBe node being alternately activated every predetermined period; and
a switching circuit that alternately performs a first operation for charging and discharging the Q node and the QBo node, respectively, or vice versa and a second operation for charging and discharging the Q node and the QBe node, respectively, or vice versa, in response to the set signal and the reset signal,
wherein a first variable high-potential voltage adaptively adjusted to correspond to a shift in a threshold voltage of the first pull-down transistor is applied to the QBo node, and a second variable high-potential voltage adaptively adjusted to correspond to a shift in a threshold voltage of the second pull-down transistor is applied to the QBe node,
wherein the monitoring TFT comprises:
a first monitoring TFT that charges a sensed voltage in a second node in response to the first variable high-potential voltage and a monitoring pulse; and
a second monitoring TFT that is connected in parallel to the first monitoring TFT and the second node and charges the sensed voltage in the second node in response to the second variable high-potential voltage and a monitoring pulse, and
wherein the first monitoring TFT and the second monitoring TFT alternately perform a sensing operation every predetermined period, and charge the sensed voltage, which is obtained by subtracting a threshold voltage from the variable high-potential voltage, in the second node.

6. The display device of claim 5, wherein the first and second variable high-potential voltages are adjusted to gradually increase in proportion to a shift in the threshold voltage of the first and second pull-down transistors.

7. The display device of claim 6, wherein the first and second variable high potential voltages are adjusted to increase in a stepwise manner every predetermined period.

* * * * *